(12) United States Patent
Saeki et al.

(10) Patent No.: US 6,676,356 B2
(45) Date of Patent: Jan. 13, 2004

(54) DEVICE FOR ATTACHING TARGET SUBSTRATE TRANSFER CONTAINER TO SEMICONDUCTOR PROCESSING APPARATUS

(75) Inventors: Hiroaki Saeki, Nirasaki (JP); Yoshiaki Sasaki, Nirasaki (JP); Yasushi Taniyama, Toyohashi (JP)

(73) Assignees: Tokyo Electron Limited, Tokyo (JP); Shinko Electric Co., Ltd., Tokyo (JP)

( * ) Notice: Subject to any disclaimer, the term of this patent is extended or adjusted under 35 U.S.C. 154(b) by 147 days.

(21) Appl. No.: 09/950,640

(22) Filed: Sep. 13, 2001

(65) Prior Publication Data

US 2002/0051701 A1 May 2, 2002

(30) Foreign Application Priority Data

Sep. 18, 2000 (JP) ........................................ 2000-282381

(51) Int. Cl.⁷ .................................................. H01J 5/02
(52) U.S. Cl. ................... 414/217; 414/222.06; 250/239
(58) Field of Search .............................. 414/217, 217.1, 414/939, 940, 411, 222.06, 222.01

(56) References Cited

U.S. PATENT DOCUMENTS

| 3,831,926 | A | * | 8/1974 | Sendoykas et al. | ......... 269/228 |
|---|---|---|---|---|---|
| 5,217,053 | A | * | 6/1993 | Foster et al. | ................... 141/98 |
| 5,609,459 | A | * | 3/1997 | Muka | ....................... 414/217.1 |
| 5,695,564 | A | * | 12/1997 | Imahashi | ..................... 118/719 |
| 6,082,951 | A | | 7/2000 | Nering et al. | |
| 6,105,782 | A | * | 8/2000 | Fujimori et al. | ............. 206/710 |
| 6,412,502 | B1 | * | 7/2002 | Bexten et al. | .............. 134/148 |
| 6,430,802 | B1 | * | 8/2002 | Miyajima | ..................... 29/464 |
| 6,446,806 | B1 | * | 9/2002 | Ohori et al. | ................. 206/454 |
| 6,501,070 | B1 | * | 12/2002 | Bacchi et al. | ................ 250/239 |

FOREIGN PATENT DOCUMENTS

JP   2000-16583   1/2000

* cited by examiner

*Primary Examiner*—Eileen D. Lillis
*Assistant Examiner*—Charles A. Fox
(74) *Attorney, Agent, or Firm*—Oblon, Spivak, McClelland, Maier & Neustadt, P.C.

(57) ABSTRACT

A table for a transfer container is provided with an opening portion formed therein. A clamp is swingably supported on the lower side of the table. The clamp has a second engaging portion hook to project upward from the table through the opening portion, and to engage with the first engaging portion of the transfer container. A first actuator is disposed to apply a swing-driving force to the clamp. The first actuator has a reciprocation rod pivotally connected to the clamp, and is swingably supported on the lower side of the table.

14 Claims, 18 Drawing Sheets

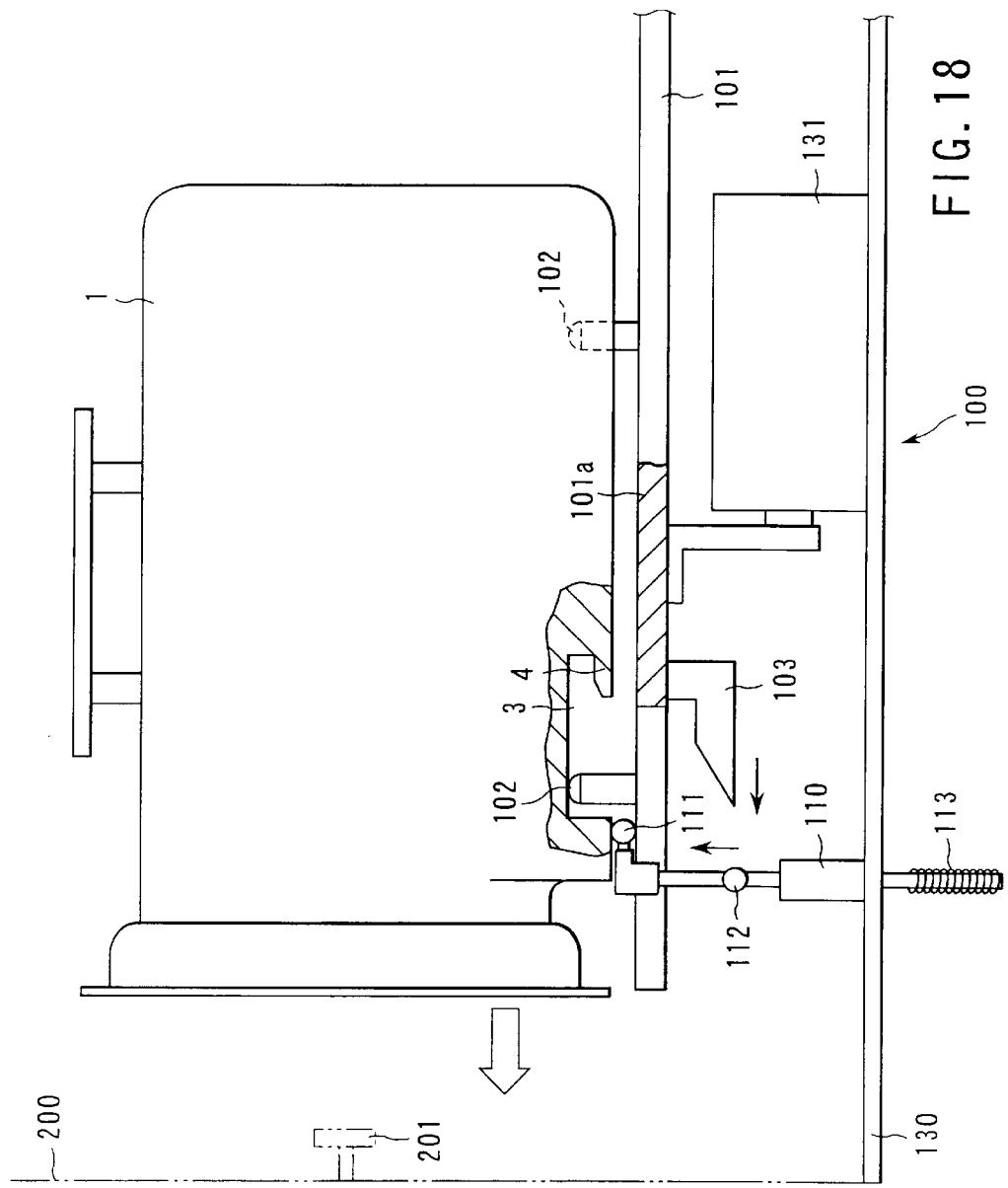

DEVICE FOR ATTACHING TARGET SUBSTRATE TRANSFER CONTAINER TO SEMICONDUCTOR PROCESSING APPARATUS

CROSS-REFERENCE TO RELATED APPLICATIONS

This application is based upon and claims the benefit of priority from the prior Japanese Patent Applications No. 2000-282381, Sep. 18, 2000, the entire contents of which are incorporated herein by reference.

BACKGROUND OF THE INVENTION

1. Field of the Invention

The present invention relates to a device for attaching a transfer container, which accommodates target substrates, such as semiconductor wafers, to a port of a semiconductor processing apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

2. Description of the Related Art

In semiconductor manufacturing steps, semiconductor wafers are processed in a clean room with control of dust, which is responsible for defects in semiconductor devices, to improve the yield. In recent years, with an increase in the integration degree of semiconductor devices, and a decrease in the size of circuits, it has become more difficult in technique and cost to realize a clean room for controlling minute particles in practice.

For this reason, it is required to develop techniques of increasing cleanness only in a local space surrounding wafers for transfer and process of the wafers, in place of techniques of increasing cleanness in clean rooms. There is a known transfer system of this kind, which utilizes a transfer container having an interior to be kept clean, and a front face to be opened and closed; (FOUP: Front Opening Unified Pod).

The transfer system is provided with an attaching device for attaching the wafer transfer container to a semiconductor processing apparatus. After the transfer container is attached at a predetermined position by the attaching device, the front face of the transfer container is opened, so that only the wafers in the container are transferred into the semiconductor processing apparatus. For example, Jpn. Pat. Appln. KOKAI Publication No. 2000-16583 (to be referred to as Prior Art 1) discloses an attaching device of this kind. FIG. 18 is a view showing the attaching device disclosed in the Prior Art 1.

The attaching device 100 shown in FIG. 18 is disposed adjacent to the I/O port of a semiconductor processing apparatus 200. A wafer transfer container 1 is placed on the mount portion 101a of a table 101 used in the attaching device 100. The bottom of the container 1 is provided with a recess 3 formed therein and a projecting piece 4 extending forward from the rear end of the recess 3. In FIG. 18, reference symbol 201 denotes a latchkey 201 disposed on the processing apparatus 200, for opening the lid of the container 1.

The table 101 is supported to be movable back and forth by an actuator 131 fixed to a base 130. The table 101 is provided with projections, e.g., four projections 102, for positioning the container 1. When the table 101 moves forward, the projections 102 engage with positioning recesses (not shown) formed on the container 1, which is placed on the mount portion 101a, so that the container 1 is moved in the same direction.

An engaging rod 110 is supported by the base 130 near the table 101, and is movable up and down. The upper end of the engaging rod 110 is provided with an engaging portion 111, which extends backward to engage with the projecting piece 4. A first guide portion 112 formed of a roller is disposed on an intermediate portion of the engaging rod 110 in the longitudinal direction. A coil spring 113 is disposed between the lower end of the engaging rod 110 and the base 130. When the engaging rod 110 moves up, the coil spring 113 is compressed and biases the engaging rod 110 downward.

A second guide portion 103 is disposed under the table 10. When the table 101 moves forward along with the container 1, the second guide portion 103 lifts the first guide portion 112. In other words, when the actuator 131 moves the table 101 forward, the second guide portion 103 comes into contact with the first guide portion 112. Consequently, the first guide portion 112 moves up, and thus the engaging rod 110 moves up as a whole, whereby the engaging portion 111 enters the recess 3.

When the table 101 further moves forward, the engaging portion 111 engages with the upper surface of the projecting piece 4. At this time, the coil spring 113 is compressed against the base 130. Consequently, the engaging rod 110 is biased downward as a whole, whereby the engaging portion 111 is held on the projecting piece 4. As a result, the container 1 is attached to the mount portion 101a.

As described above, the conventional attaching device 100 moves the table 101 forward to cause the engaging portion 111 of the engaging rod 110 to engage with the projecting piece 4 of the container 1, so that the container 1 is attached to the mount portion 101a. Accordingly, when the positioning projections 102 of the table 101 are not aligned with the corresponding recesses of the container 1, some problems are brought about. Specifically, in this case, an operation error cannot be found until the engaging portion 111 of the engaging rod 110 does not engage with the projecting piece 4 while the table 101 moves forward. Then, the table 101 has to be returned to the initial position, so that the operation of attaching the container 1 to the mount portion 101a is performed again. This reduces the efficiency in transferring wafers.

BRIEF SUMMARY OF THE INVENTION

An object of the present invention is to provide an attaching device, which allows a transfer container to be reliably held on a mount portion by a clamp, without waiting for a table to be moved after the transfer container is placed on the mount portion.

According to a first aspect of the present invention, there is provided a device for attaching a transfer container, which accommodates a target substrate, to a port of a semiconductor processing apparatus, the transfer container having on a front side an opening portion to be aligned with the port, and on a bottom side a first engaging portion, the device comprising:

a table having a mount portion on an upper side, on which the transfer container is placed, and an opening portion formed at a position corresponding to the first engaging portion;

a clamp swingably supported on a lower side of the table, and having a second engaging portion, which projects upward from the table through the opening portion to engage with the first engaging portion when the clamp swings; and a first actuator configured to apply a swing-driving force to the clamp, the first actuator having a reciprocation rod, which pivotally supports the clamp, and swingably supported on the lower side of the table.

According to a second aspect of the present invention, there is provided a device for attaching a transfer container, which accommodates a target substrate, to a port of a semiconductor processing apparatus, the transfer container having on a front side an opening portion to be aligned with the port, and on a bottom side a first engaging portion, the device comprising:

a table having a mount portion on an upper side, on which the transfer container is placed, and an opening portion formed at a position corresponding to the first engaging portion;

a link swingably supported on a lower side of the table about a first rotational axis used as a center;

a clamp swingably supported by the link about a second rotational axis used as a center, and having a second engaging portion, which projects upward from the table through the opening portion to engage with the first engaging portion when the clamp swings in a first direction;

a first actuator configured to apply a swing-driving force to the clamp; and a control structure configured to control swing of the link and the clamp, and set such that, when the first actuator applies a swing-driving force to the clamp in the first direction, the clamp swings relative to the link about the second rotational axis used as a center in a first period until the second engaging portion enters the first engaging portion, and then the link swings along with the clamp relative to the table about the first rotational axis used as a center, thereby moving the clamp downward for the second engaging portion to catch the first engaging portion in a second period following the first period.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 18 is a structural view showing a conventional attaching device.

DETAILED DESCRIPTION OF THE INVENTION

Figure 1:
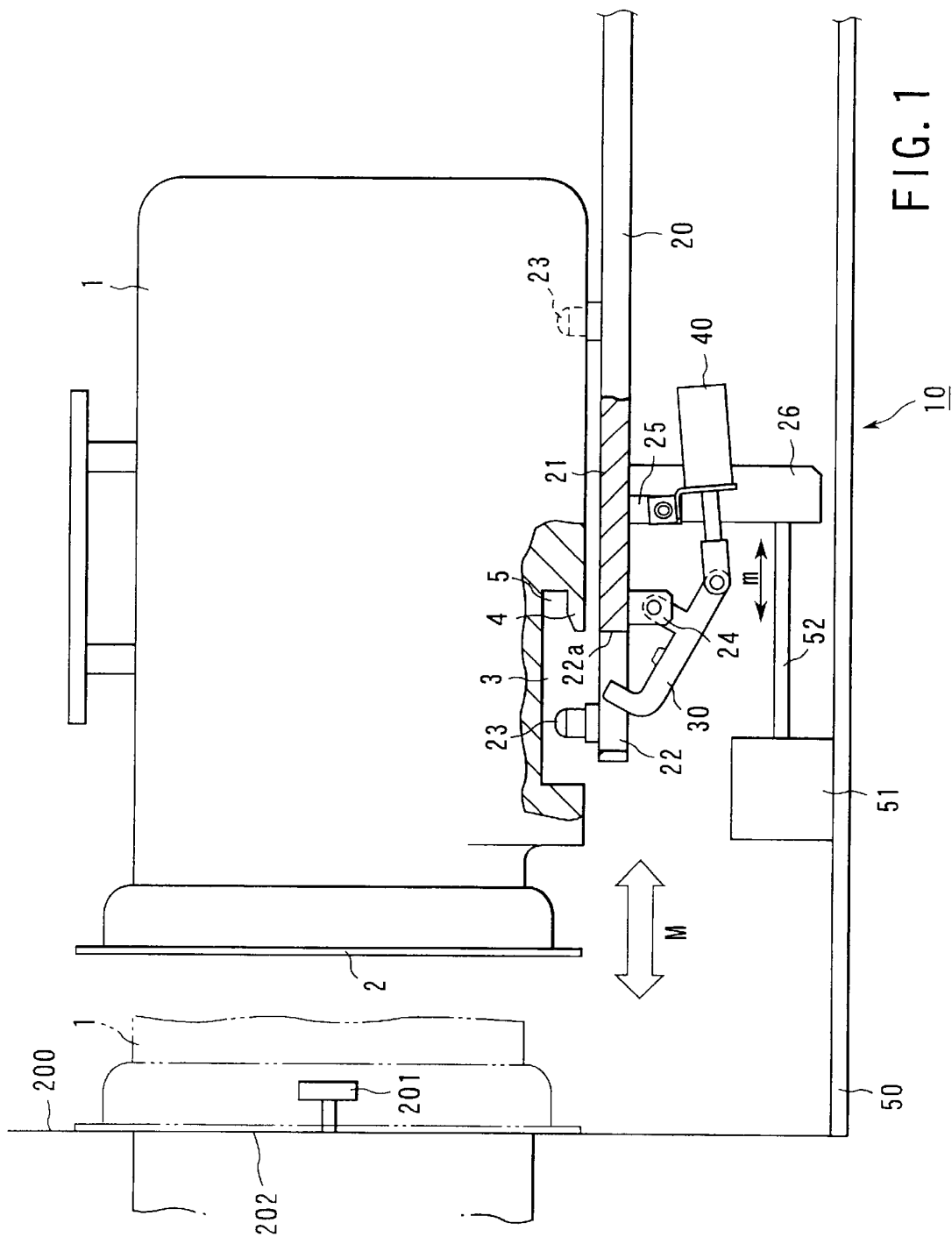
FIG. 1 is a structural view showing a device according to a first embodiment of the present invention, for attaching a transfer container, which accommodates semiconductor wafers, to a port of a semiconductor processing apparatus.

Embodiments of the present invention will be described hereinafter with reference to the accompanying drawings. In the following description, the constituent elements having substantially the same function and arrangement are denoted by the same reference numerals, and a repetitive description will be made only when necessary.

[1] First Embodiment

[1-1] Outline of First Embodiment

FIG. 1 is a structural view showing a device 10 according to a first embodiment of the present invention, for attaching a transfer container, which accommodates semiconductor wafers, to a port of a semiconductor processing apparatus.

As shown in FIG. 1, the attaching device 10 is disposed adjacent to the I/O port 202 of the semiconductor processing apparatus 200. The wafer transfer container 1 utilized in the attaching device 10 accommodates a plurality of wafers (not shown). The front of the container 1 is provided with an opening portion 2 for taking out the wafers, which is closed by a lid. The bottom of the container 1 is provided with a recess 3 formed therein and a projecting piece 4 extending forward from the rear end of the recess 3. Accordingly, an engaging groove or hole 5 extending laterally from the recess 3 to the upper side of the projecting piece 4 is formed on the bottom of the container 1. The projecting piece 4 and the engaging hole 5 are arranged to engage with the hook of a clamp described later.

As indicated by one-dot-chain lines in FIG. 1, in a state where the transfer container 1 is attached to the processing apparatus 200, the front of the container 1 is in close contact with the portion around the I/O port 202 of the processing apparatus 200. At this time, the bottom of the container 1 is placed on and fixed to a mount portion 21, which is formed on the upper side of a table 20 employed in the attaching device 10. In this state, the opening portion 2 of the container 1 is aligned with the port 202, so that a latchkey 201 disposed on the processing apparatus 200 can open the lid of the opening portion 2.

The table 20 is arranged to be movable back and forth (in an arrow M direction), so that the container 1 is moved toward and away from the I/O port 202 of the processing apparatus 200. An actuator 51 for moving the table 20 is disposed under the table 20 and fixed to a base 50. The mount portion 21 of the table 20 is provided with projections, e.g., four projections 23, for positioning the container 1. When the table 101 moves forward, the projections 23 engage with positioning recesses (not shown) formed on the container 1, which is placed on the mount portion 21, so that the container 1 is moved in the same direction.

A rectangular opening portion 22 is formed in the mount portion 21 of the table 20 at a position corresponding to the recess 3 and the engaging hole 5 on the bottom of the container 1. A clamp 30 is swingably supported under the table 20. The clamp 30 has a hook 34, which projects upward from the table 20 through the opening portion 22 to enter and engage with the engaging hole 5 of the container 1 when the clamp 30 swings. Part of the wall surface 22a of the table 20, which defines the opening portion 22, functions as a clamp stopper for stopping the clamp 30 swinging. An actuator 40 formed of an electromagnetic linear actuator for supplying the clamp 30 with a swing-driving force is supported under the table 20.

A pair of brackets 24, a single bracket 25, and a single bracket 26 are disposed on the lower side of the table 20. The clamp 30 is swingably supported by the pair of brackets 24. The actuator 40 is supported by the bracket 25 swingably in the same direction as the clamp 30. The bracket 26 is connected to the reciprocation rod 52 of the actuator 51 for the table 20.

Figure 2:
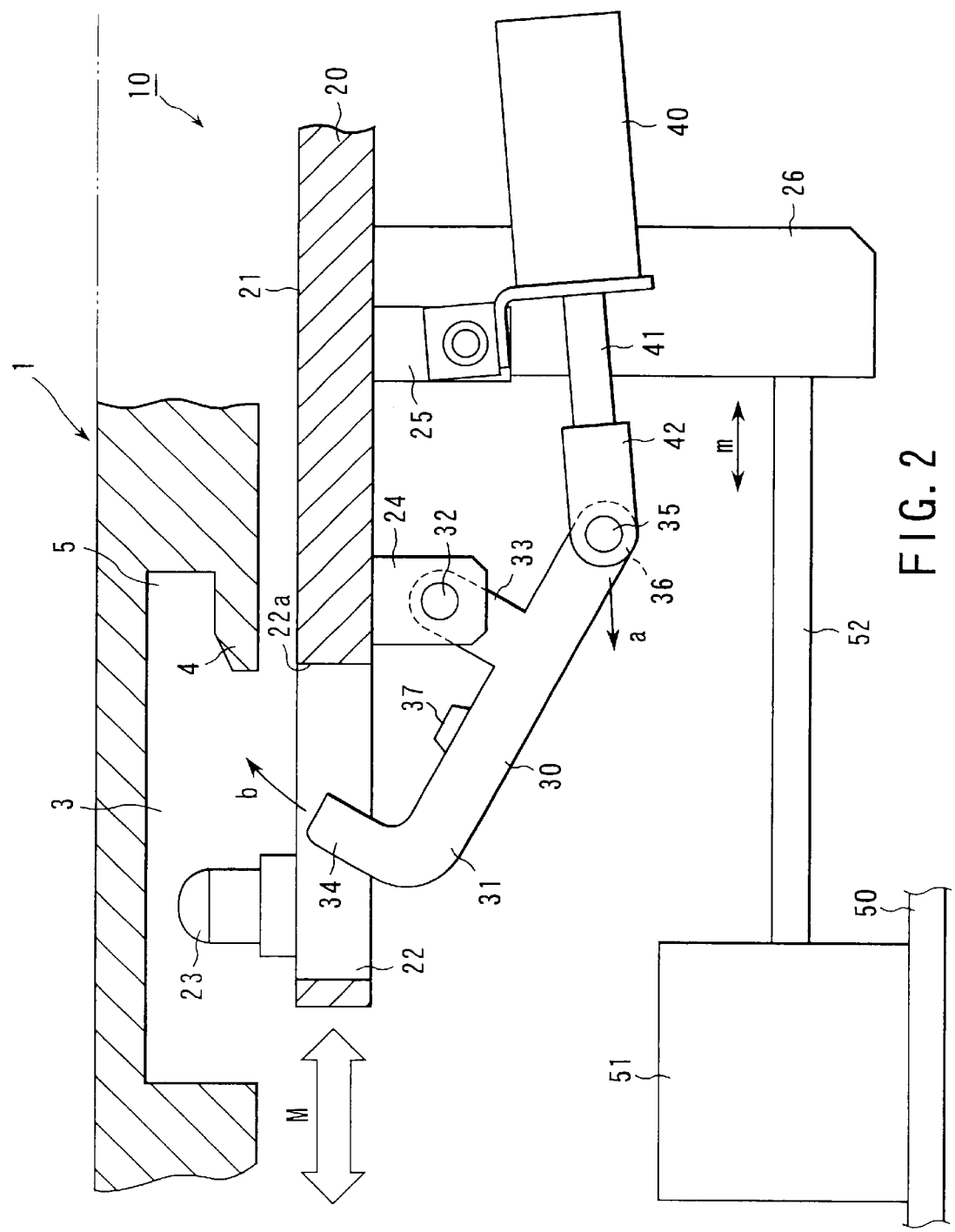
FIG. 2 is an enlarged view showing the main part of the device according to the first embodiment.

As shown in FIG. 2, the actuator 40 for the clamp 30 has a reciprocation rod 41. The distal end of the rod 41 is provided with a fork 42, which is pivotally connected to a connecting portion 36 of the clamp 30 described later, to move the connecting portion 36 back and forth (in an arrow a direction). On the other hand, the actuator 51 reciprocates the rod 52 to move the bracket 26 in an arrow m direction, as shown in FIG. 1. With this movement, the table 20 is moved in an arrow M direction.

[1-2] Structure of Clamp 30

Figure 3:
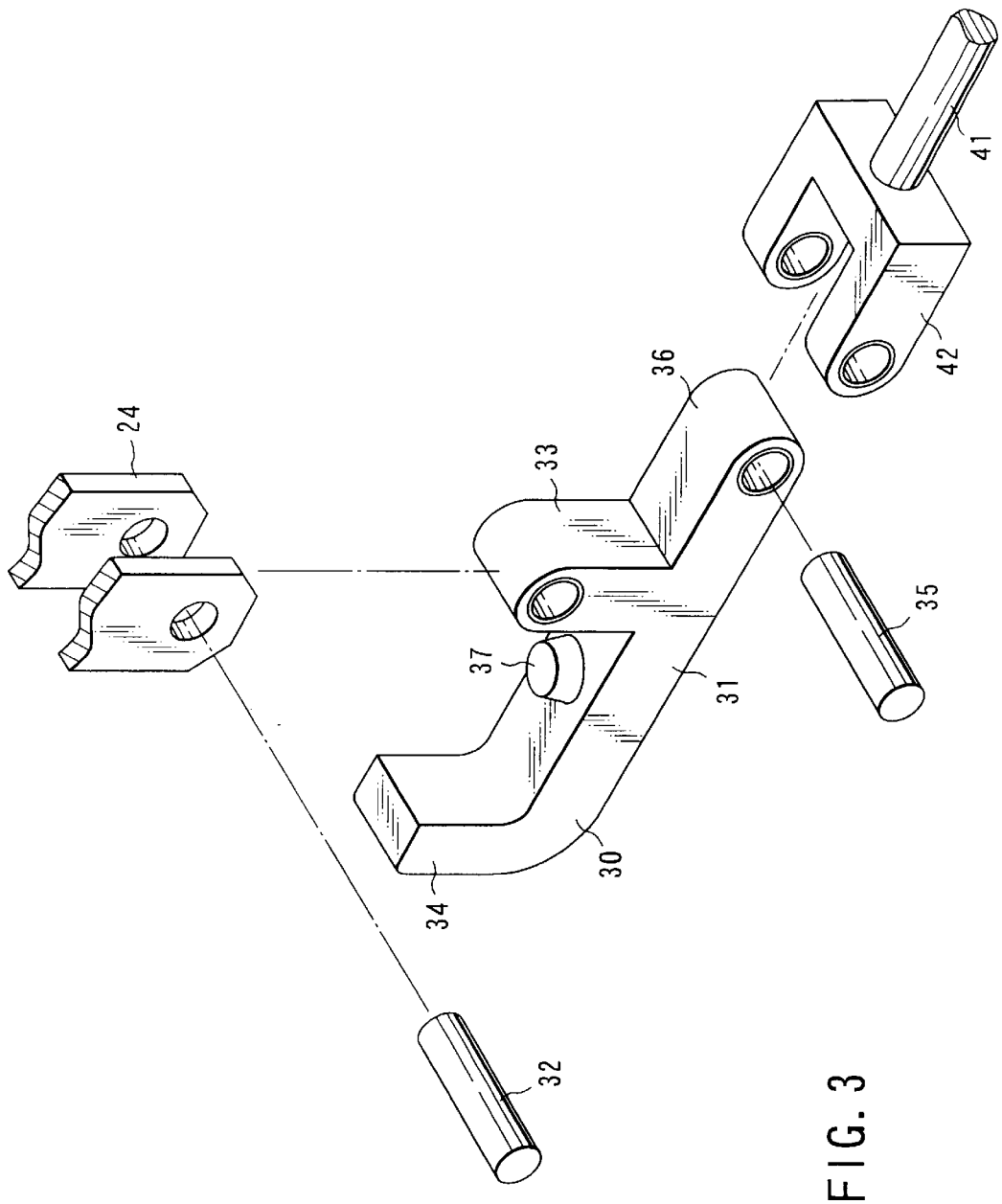
FIG. 3 is an exploded perspective view showing a clamp and so forth employed in the device according to the first embodiment.

FIG. 2 is an enlarged view showing the main part of the attaching device 20. FIG. 3 is an exploded perspective view showing the clamp and so forth employed in the device.

The clamp 30 has a near F shape in the cross section. More specifically, the clamp 30 has a lever portion 31 with a pivot portion 33 projecting from a halfway position in the longitudinal direction. The pivot portion 33 is pivotally connected to the brackets 24 by a pin 32, so that it is swingable. One end of the lever portion 31 is provided with the hook 34, which projects upward from the table 20 through the opening portion 22 to enter and engage with the engaging hole 5 of the container 1 when the clamp 30 swings. The other end of the lever portion 31 is provided with the connecting portion 36 pivotally connected to the fork 42 of the actuator 40 by a pin 35. A bumper 37 formed of an elastic material (such as rubber) is disposed on the upper side of the lever portion 31 between the pivot portion 33 and the hook 34. The bumper 37 comes into contact with the clamp stopper 22a at the opening portion 22 of the table 20, when the clamp 30 swings.

As shown in FIG. 3, the connecting portion 36 of the clamp 30 is inserted in the fork 42 of the actuator 40, and is pivotally connected thereto by the pin 35. The pivot portion 33 is inserted in the brackets 24, and is pivotally connected thereto by the pin 32. With this arrangement, the clamp 30 is assembled onto the table 20 such that the pin 32 of the pivot portion 33 functions as a swing center (fulcrum), the pin 35 of the connecting portion 36 functions as a force-applying point, and the hook 34 functions as an action point. The bumper 37 and the clamp stopper 22a form a restricting structure for restricting the swing of the clamp 30.

[1-3] Operation of Attaching Device 10

Figure 4:
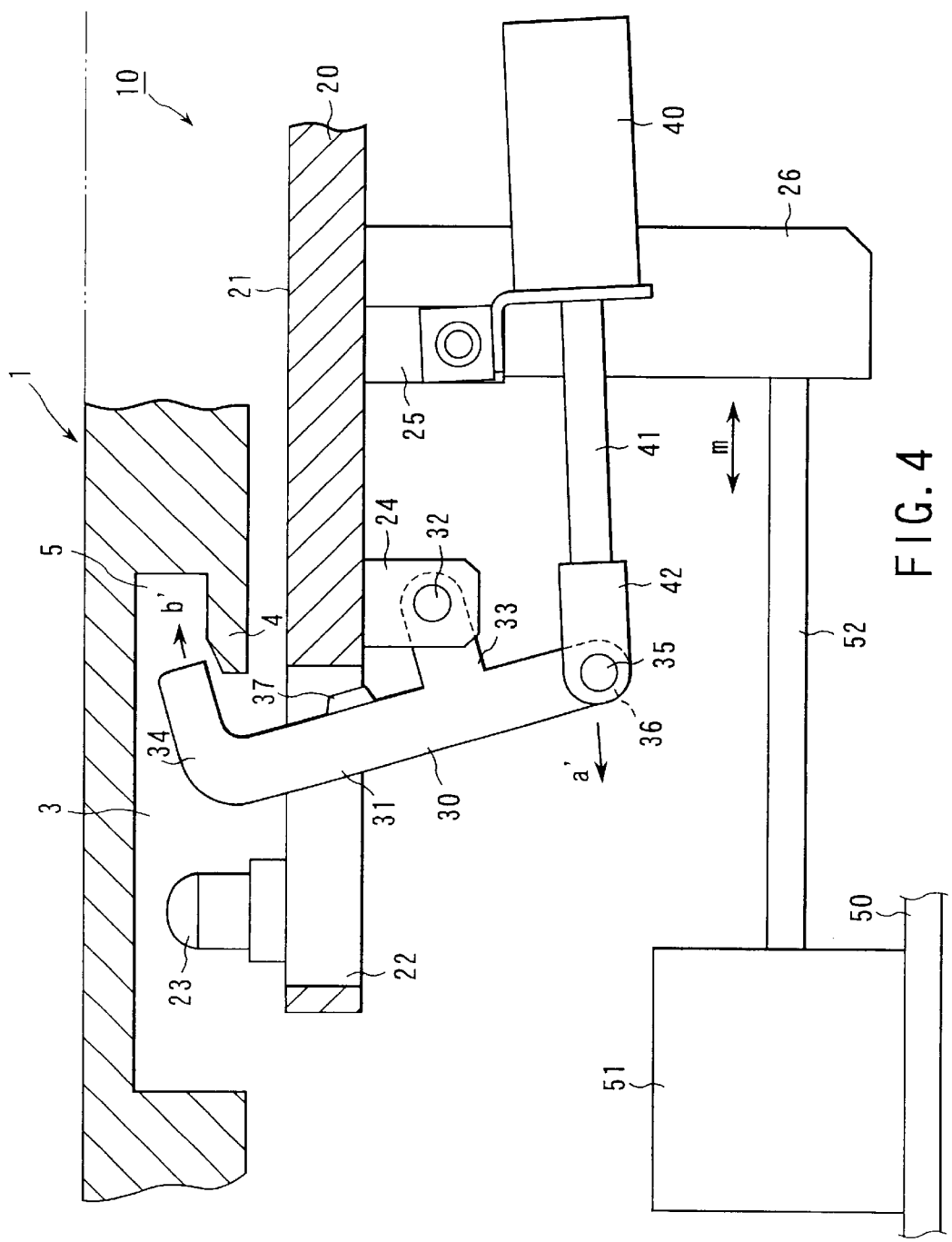
FIG. 4 is a view showing a state where the clamp has swung in the device according to the first embodiment.
Figure 5:
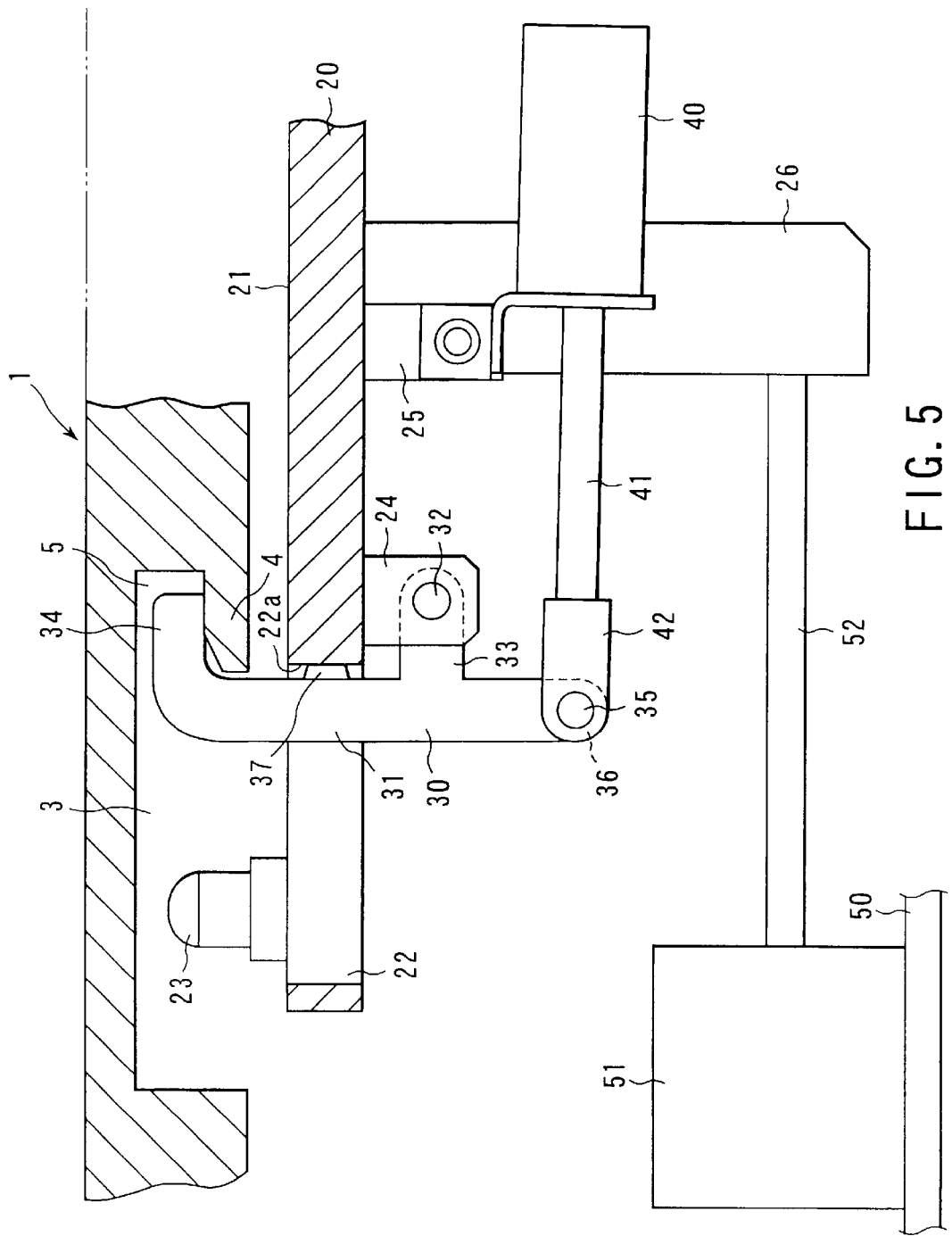
FIG. 5 is a view showing a state where the clamp has swung, following FIG. 4.

An explanation will be given of an operation of the attaching device 10, with reference to FIGS. 1, 2, 4, and 5. FIGS. 4 and 5 are views showing a state where the clamp 30 of the attaching device 10 has swung.

First, as shown in FIG. 1, the container 1 is placed on the mount portion 21 of the table 20 by an operator. At this time, the container 1 is placed such that the positioning projections 23 engage with the corresponding recesses (not shown) of the container 1. Then, a switch (not shown) is operated by the operator to activate the actuator 40.

The actuator 40 moves the rod 41 forward to move the pin 35 in an arrow a direction, as shown in FIG. 2. At this time, the clamp 30 swings in an arrow b direction (clockwise) about the pin 32 used as the center. Consequently, the hook 34 of the clamp 30 enters the recess 3, as shown in FIG. 4. The actuator 40 further moves the rod 41 in an arrow a' direction, and the clamp 30 swings in an arrow b' direction, so the hook 34 enters the engaging hole 5, and the bumper 37 comes into contact with the clamp stopper 22a at the opening portion 22, as shown in FIG. 5. In this state, the hook 34 pushes the projecting piece 4 downward, whereby the container 1 is fixed to the mount portion 21 of the table 20 by the clamp.

Then, the actuator 51 is activated to move the table 20 along with the container 1 attached thereto toward the semiconductor processing apparatus 200. Consequently, the front of the container 1 comes into close contact with the portion around the I/O port 202 of the processing apparatus 200, and the opening portion 2 of the container 1 is aligned with the port 202, as indicated by one-dot-chain lines in FIG. 1. In this state, the latchkey 201 disposed on the processing apparatus 200 can open the lid of the opening portion 2.

As described above, the attaching device 10 according to this embodiment performs attaching of the container 1 to the mount portion 21 and movement of the table 20, independently from each other. As a result, the container 1 is securely attached to the mount portion 21 before the table 20 starts being moved.

On the other hand, when the container 1 is detached from the mount portion 21, an operation is performed in reverse to that described above. Specifically, the actuator 40 moves the rod 41 backward, and the clamp 30 swings counterclockwise about the pin 32 used as the center. With this operation, the hook 34 first separates from the projecting piece 4, and then retreats from the engaging hole 5.

[1-4] Effect of First Embodiment

The attaching device 10 according to this embodiment allows the container 1 to be securely attached to the mount portion 21 by the clamp 30 while the container 1 is placed on the table 20. If the positioning projections 23 are not exactly positioned relative to the corresponding recesses of the container 1 when the container 1 is placed on the mount portion 21, the hook 34 cannot securely engage with the projecting piece 4. Consequently, it can be immediately found that the container 1 is not securely attached to the mount portion 21.

In this respect, Prior Art 1 causes the engaging portion 111 of the engaging rod 110 to engage with the projecting piece 4 while the table is moving. Where the attaching operation ends in failure, the table has to be returned to the initial position to repeat the operation of attaching the container 1. In contrast, this embodiment performs attaching of the container 1 to the mount portion 21 and movement of the table 20, independently from each other, whereby, even if the attaching of the container 1 to the mount portion 21 ends in failure, the attaching operation can be immediately repeated. This improves the efficiency in transferring wafers, thereby improving the process efficiency of semiconductor processes.

[1-5] Modification of First Embodiment

Figure 6:
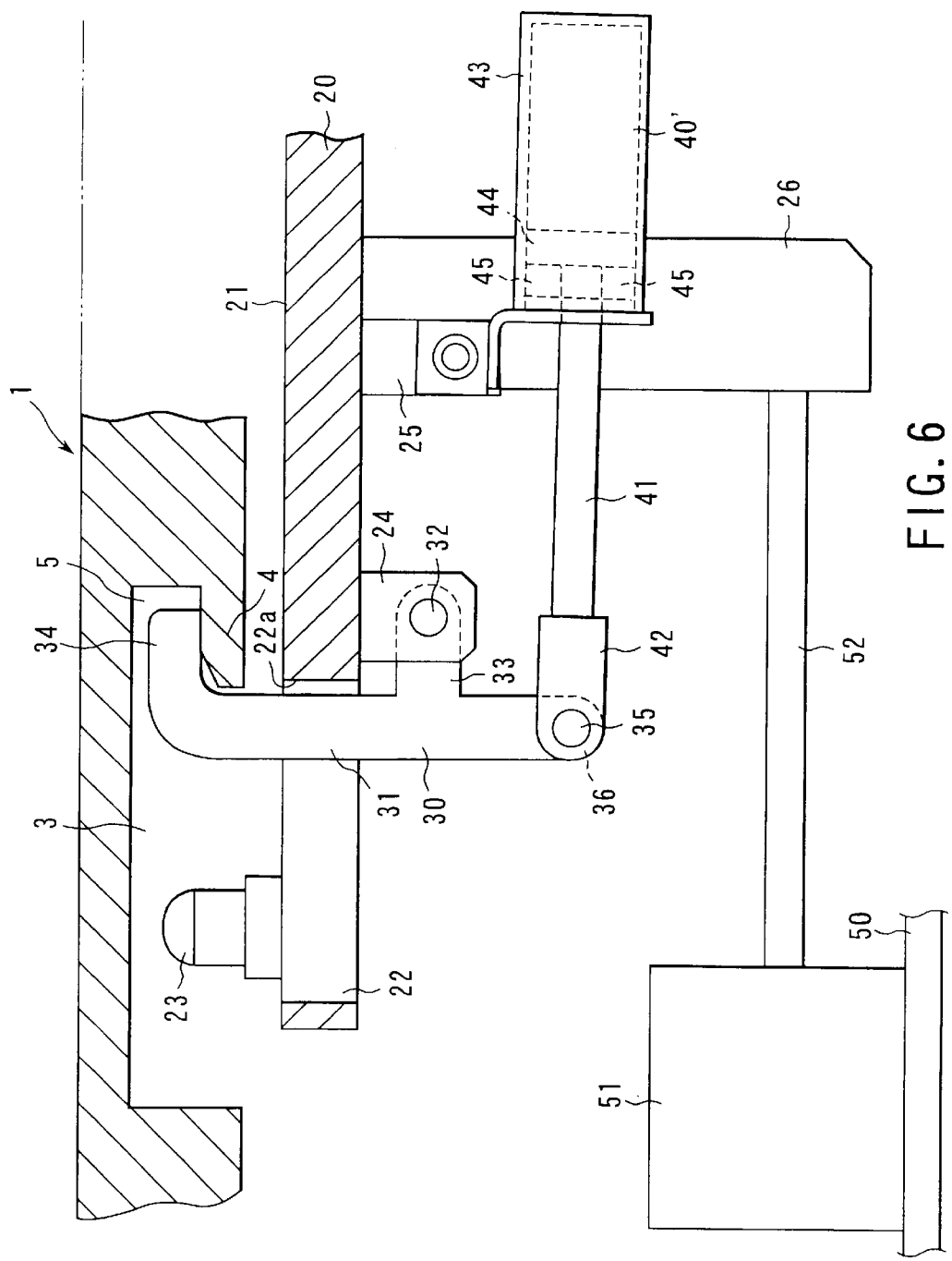
FIG. 6 is an enlarged view showing the main part of an attaching device according to a modification of the first embodiment.

FIG. 6 is an enlarged view showing the main part of an attaching device according to a modification of the first embodiment. In the structure shown in FIG. 2, the bumper 37 disposed on the clamp 30 comes into contact with the clamp stopper 22a, thereby restricting the swing of the clamp 30. On the other hand, the embodiment shown in FIG. 6 is provided with a member disposed in an actuator 40' to define the stroke of a reciprocation rod 41, thereby restricting the swing of a clamp 30.

More specifically, the actuator 40' has a rod 41, fork 42, cylinder 43, and piston 44, as in the actuator 40 shown in FIG. 2. The rod 41 of the actuator 40' reciprocates relative to the cylinder 43 while the piston 44 slides in the cylinder 43. A stopper 45 is disposed at one end in the cylinder 43. As shown in FIG. 6, when the piston 44 comes into contact with the stopper 45, a hook 34 of the clamp 30 engages with a projecting piece 4.

[2] Second Embodiment

[2-1] Outline of Second Embodiment

Figure 7:
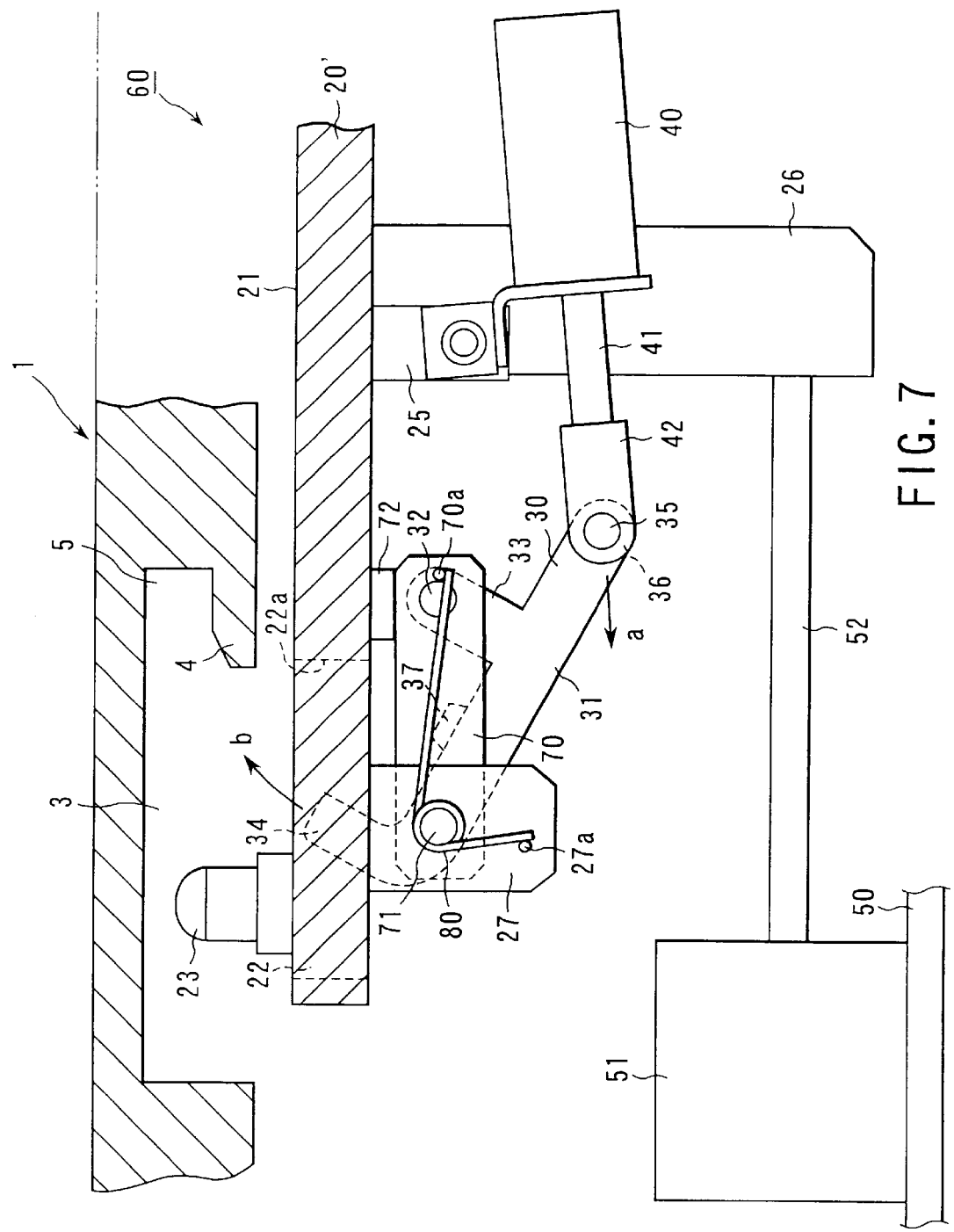
FIG. 7 is a structural view showing a device according to a second embodiment of the present invention, for attaching a transfer container, which accommodates semiconductor wafers, to a port of a semiconductor processing apparatus.
Figure 8:
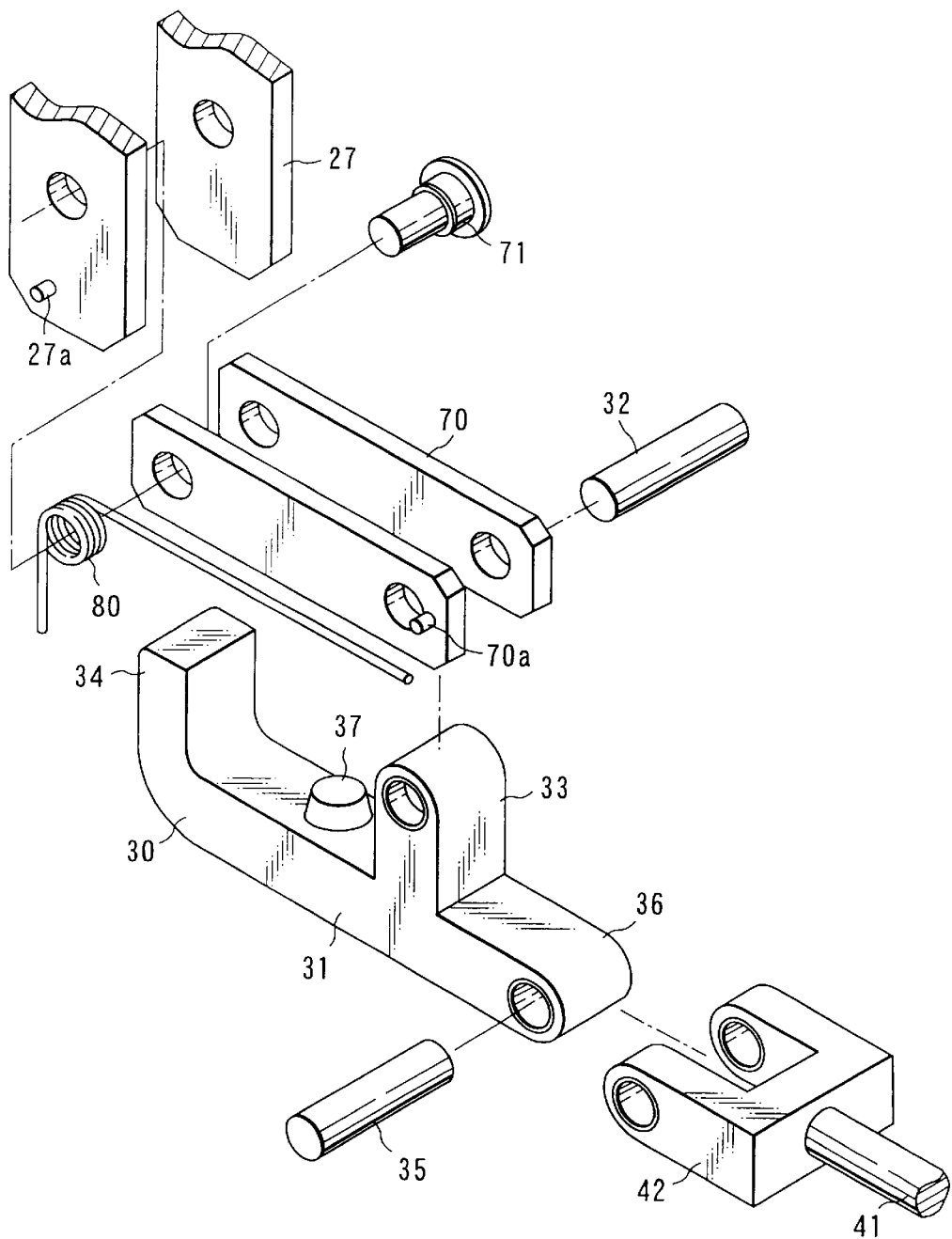
FIG. 8 is an exploded perspective view showing a clamp, links, and so forth employed in the device according to the second embodiment.

FIG. 7 is a structural view showing a device 60 according to a second embodiment of the present invention, for attaching a transfer container, which accommodates semiconductor wafers, to a port of a semiconductor processing apparatus. FIG. 8 is an exploded perspective view showing a clamp, links, and so forth employed in the device 60. As compared to the device 10 according to the first embodiment, the device 60 according to the second embodiment is characterized in that links 70 are swingably supported by a table 20', and a clamp 30 is swingably supported by the links 70.

As in the table 20, the table 20' is arranged to be movable back and forth, so that the container 1 is moved toward and away from the I/O port 202 of the processing apparatus 200 (see FIG. 1). A pair of brackets 27 are disposed on the lower side of the table 20'. The pair of links 70 are respectively swingably supported by the pair of brackets 27 each with a pin 71. FIG. 8 shows only one of the pins 71. Furthermore, the clamp 30 is swingably supported by the distal ends of the links 70 with a pin 32. The clamp 30 has basically the same shape as that in the device 10 shown in FIG. 2.

Each of the pins 71 pivotally supporting the links 70 is provided with a coil spring 80 on the outer side of the corresponding link 70. The coil spring 80 is arranged such that its short and long action arms respectively engage with the inner sides of projections 27a and 70a to be compressed therebetween, wherein the projections 27a and 70a are respectively formed on the corresponding bracket 27 and link 70. Consequently, the coil springs 80 provide the links 70 with a rotational biasing force, which is directed counterclockwise in FIG. 7, about the pins 71 used as the center. In other words, the coil springs 80 provide the links 70 with a biasing force in a direction so as to bias upward the ends of the links 70 on the pin 32 side, where the clamp 30 is supported.

That portion on the lower side of the table 20', which is located above the ends of the links 70 on the pin 32 side, functions as a link stopper for stopping the links 70 against the biasing force of the coil springs 80. The link stopper is provided with a bumper 72 made of a resin. In place of being disposed on the link stopper of the table 20', the bumper 72 may be disposed on that portion of the links 70, which comes into contact with the link stopper.

As in the device 10 shown in FIG. 2, a single bracket 25 is disposed on the lower side of the table 20'. An actuator 40 is supported by the bracket 25 swingably in the same direction as the clamp 30. The distal end of the reciprocation rod 41 of the actuator 40 is provided with a fork 42. A connecting portion 36 of the clamp 30 is inserted in the fork 42 of the actuator 40, and is pivotally connected thereto by a pin 35.

A pivot portion 33 of the clamp 30 is inserted between the distal ends of the pair of links 70, and is pivotally connected thereto by a pin 32. With this arrangement, the clamp 30 is swingable relative to the links 70 about the pin 32 of the pivot portion 33 used as the center. The links 70 are attached to the brackets 27 along with the coil springs 80 by the pins 71, and are swingably supported relative to the table 20'.

As a result, the clamp 30 and the links 70 are assembled onto the table 20', such that the pin 32 of the pivot portion 33 functions as a second rotational axis (first fulcrum), the pins 71 of the links 70 function as a first rotational axis (second fulcrum), the pin 35 of the connecting portion 36 functions as a force-applying point, and the hook 34 functions as an action point.

[2-2] Operation of Attaching Device 60

Figure 9:
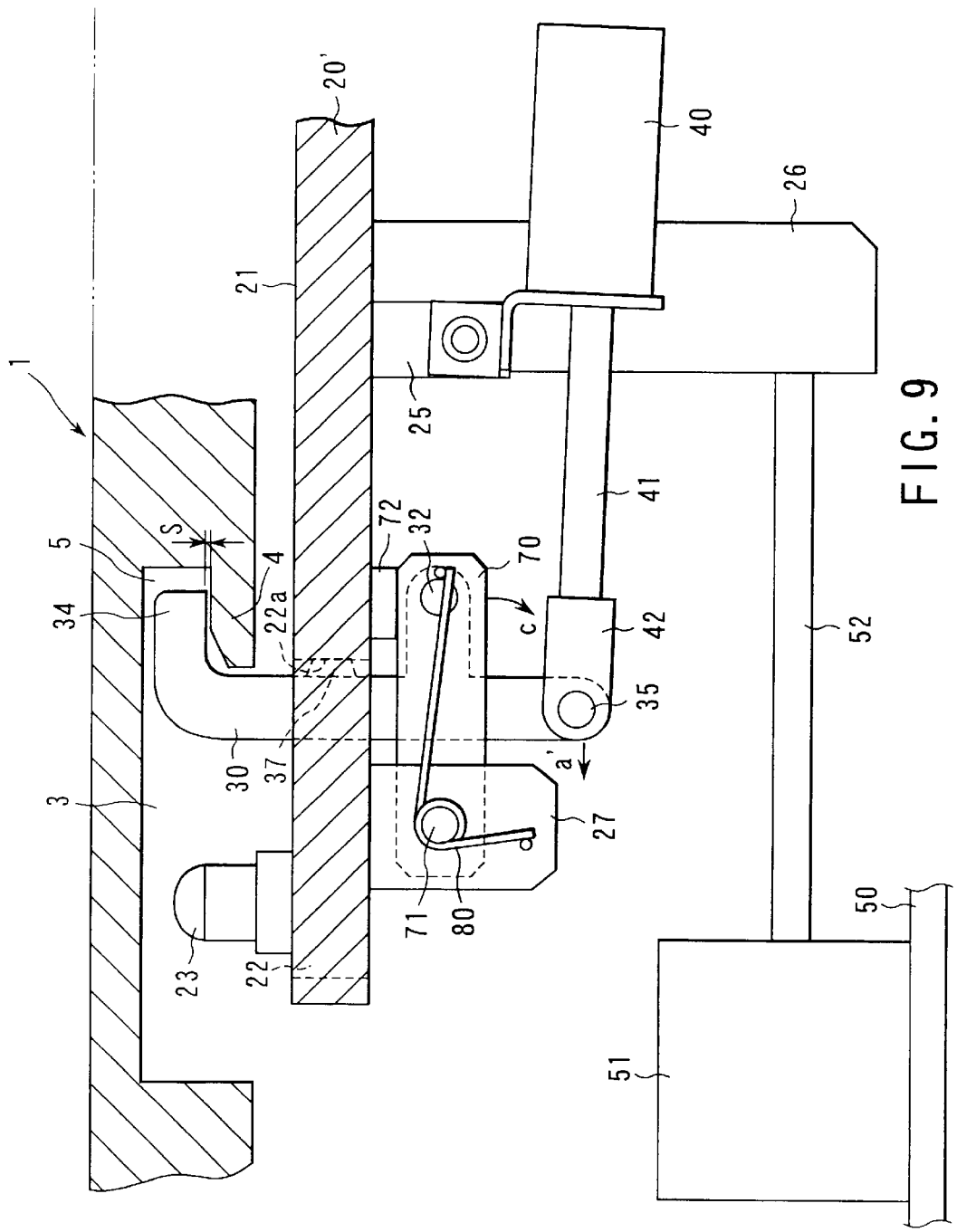
FIG. 9 is a view showing a state where the clamp has swung in the device according to the second embodiment.
Figure 10:
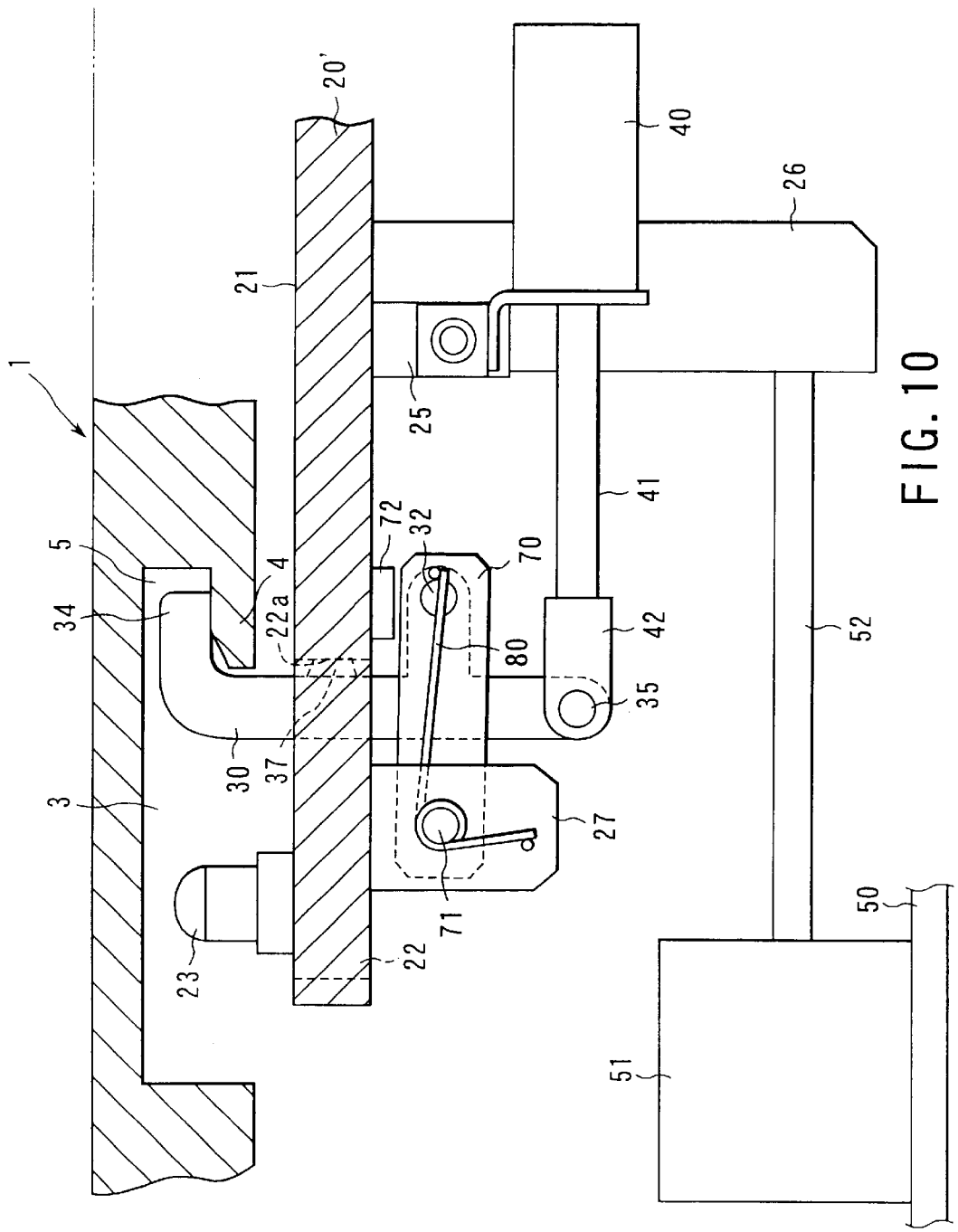
FIG. 10 is a view showing a state where the link has swung, following FIG. 9.

An explanation will be given of an operation of the attaching device 60, with reference to FIGS. 7, 9, and 10. FIGS. 9 and 10 are views showing a state where the clamp 30 of the attaching device 60 has swung.

First, the container 1 is placed on a mount portion 21 of the table 20' by an operator, and a switch (not shown) is operated by the operator to activate the actuator 40. The actuator 40 moves the rod 41 forward to move the pin 35 in an arrow a direction, as shown in FIG. 7. At this time, the clamp 30 swings in an arrow b direction (clockwise) about the pin 32 (the second rotational axis) used as the center. Consequently, the clamp 30 swings relative to the links 70, until a bumper 37 of the clamp 30 comes into contact with a clamp stopper 22a at an opening portion 22, as shown in FIG. 9. When the bumper 37 comes into contact with the clamp stopper 22a, the hook 34 of the clamp 30 enters the engaging hole 5, but the distal end of the hook 34 does not come into contact with the upper side of a projecting piece 4. Namely, there is a small gap S between the hook 34 and the projecting piece 4.

From a state where the bumper 37 is in contact with the clamp stopper 22a, the actuator 40 further moves the rod 41 forward in an arrow a' direction, whereby the pushing force of the actuator 40 onto the rod 41 overcomes the biasing force of the coil springs 80. Consequently, the swing action of the clamp 30 about the pin 32 used as the center is switched to a swing action of the links 70 about the pins 71 used as the center. The links 70 swing along with the clamp 30 in an arrow c direction (clockwise) about the pins 71 used as the center. As the links 70 swing about the pins 71 used as the center to move their distal ends downward, the clamp 30 also moves downward. As a result, as shown in FIG. 10, the hook 34 comes into contact with the lower surface of the engaging hole 5, i.e., the upper side of the projecting piece 4.

On the other hand, when the container 1 is detached from the mount portion 21, an operation is performed in reverse to that described above. Specifically, the actuator 40 moves the rod 41 backward, and the links 70 first swing counterclockwise about the pins 71 used as the center, whereby the hook 34 separates upward from the projecting piece 4. The rod 41 is further moved backward, and the clamp 30 swings counterclockwise about the pin 32 used as the center, whereby the hook 34 retreats from the engaging hole 5.

[2-3] Effect of Second Embodiment

The attaching device 60 according to this embodiment uses the hook 34 of the clamp 30 to press down the projecting piece 4 of the container 1 from above. As a result, as compared to the attaching device 10 according to the first embodiment, the attaching device 60 allows the container 1 to be more securely fixed to the mount portion 21.

[3] Third Embodiment

[3-1] Outline of Third Embodiment

Figure 11:
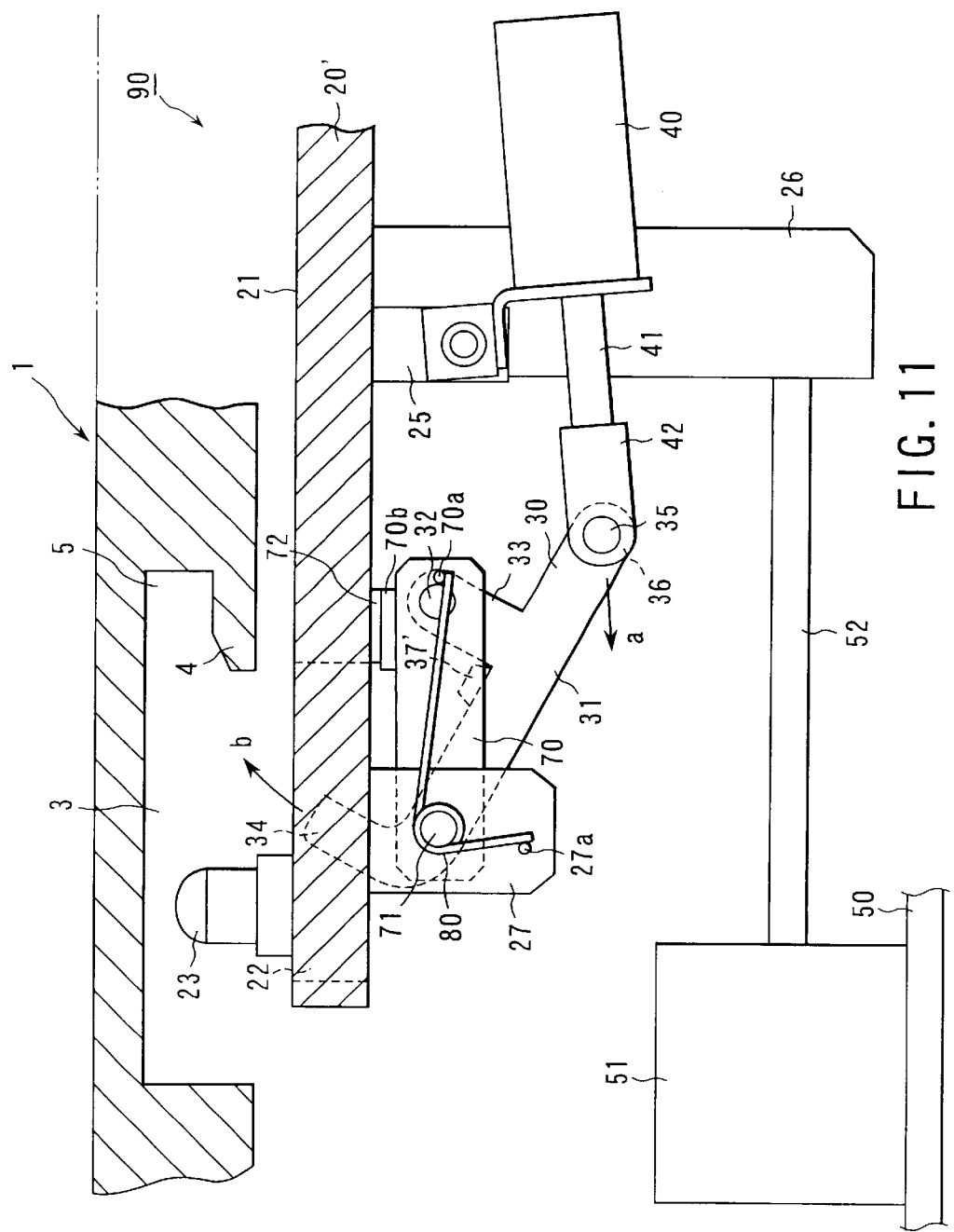
FIG. 11 is a structural view showing a device according to a third embodiment of the present invention, for attaching a transfer container, which accommodates semiconductor wafers, to a port of a semiconductor processing apparatus.
Figure 12:
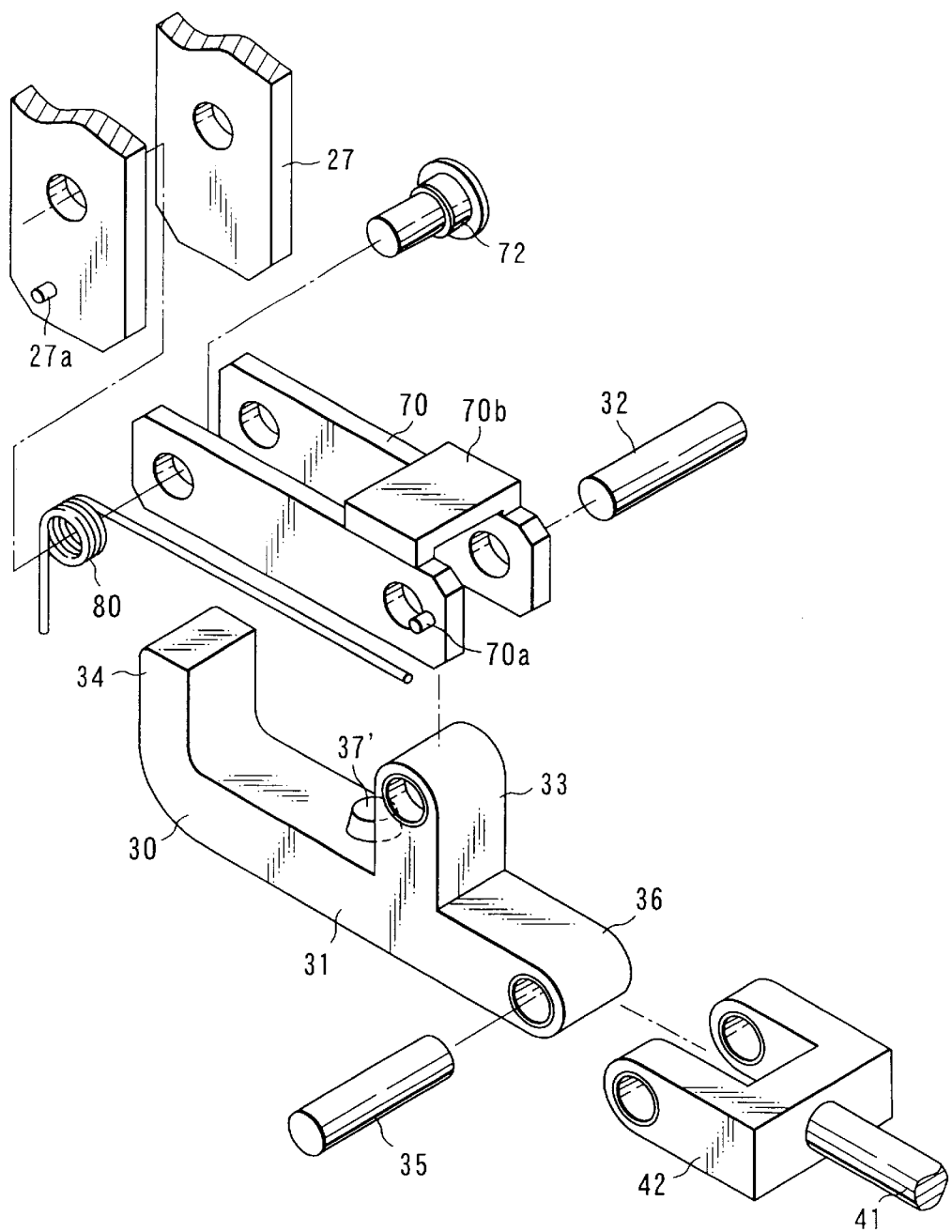
FIG. 12 is an exploded perspective view showing a clamp, link, and so forth employed in the device according to the third embodiment.

FIG. 11 is a structural view showing a device 90 according to a third embodiment of the present invention, for attaching a transfer container, which accommodates semiconductor wafers, to a port of a semiconductor processing apparatus. FIG. 12 is an exploded perspective view showing a clamp, links, and so forth employed in the device 90. As compared to the device 60 according to the second embodiment, the device 90 according to the third embodiment is characterized in that a member (clamp stopper) for restricting the swing of a clamp 30 relative to links 70 is disposed on the links 70.

More specifically, the pair of links 70 are connected to each other by a stopper plate 70b. The stopper plate 70b is located to correspond to a position where the links 70 come into contact with a link stopper 72 on the lower side of a table 20' by the biasing force of coil springs 80. A bumper 37' formed of an elastic material (such as rubber) is disposed on the upper side of a lever portion 31 of a clamp 30. As compared to the bumper 37 shown in FIGS. 2 and 6, the bumper 37' is located closer to a pivot portion 33. The stopper plate 70b and the bumper 37' are arranged to come into contact with each other, thereby restricting the swing of the clamp 30 relative to the links 70, when the clamp 30 swings relative to the links 70 clockwise about a pin 32 used as the center, as shown in FIG. 11.

[3-2] Operation of Attaching Device 90

Figure 13:
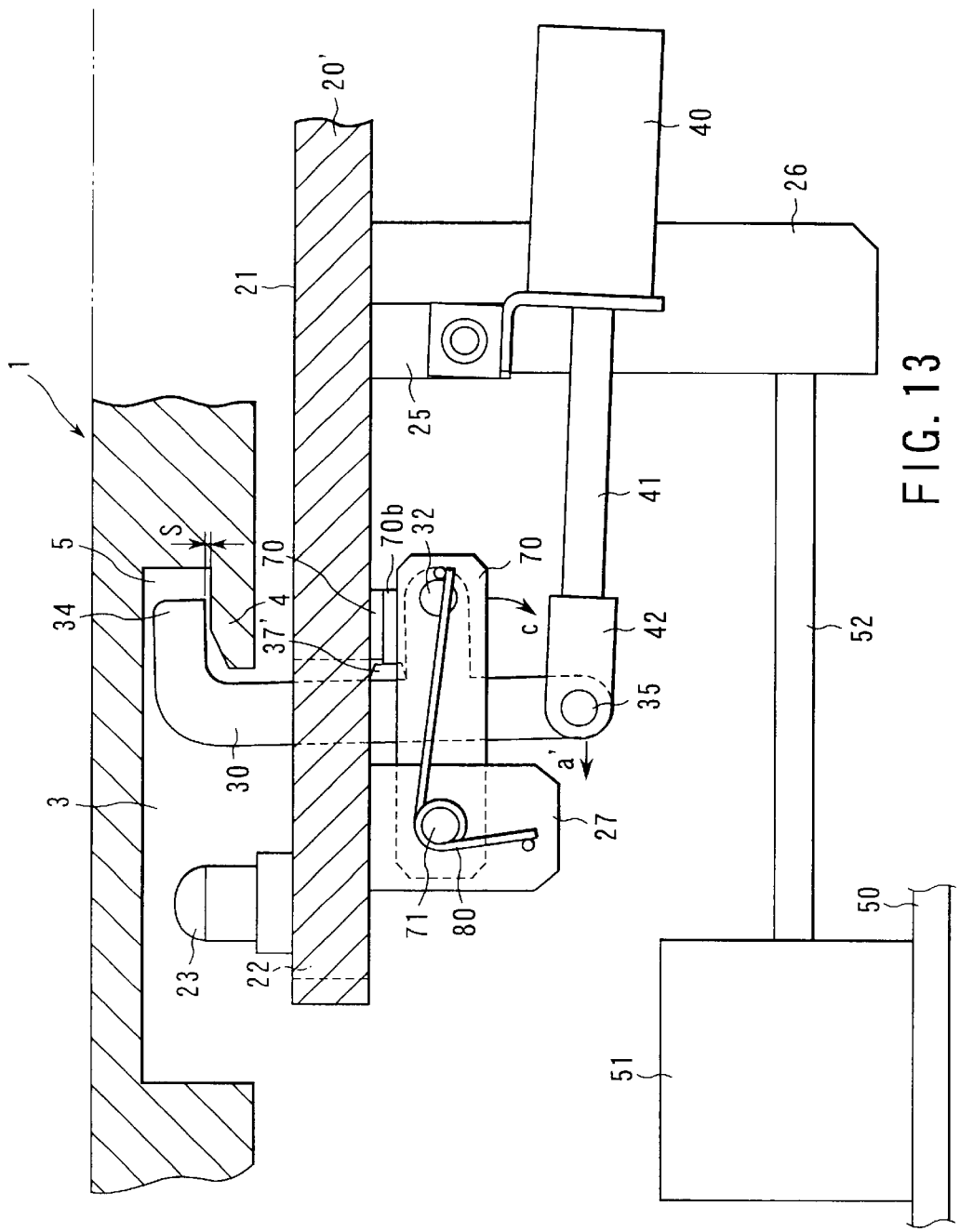
FIG. 13 is a view showing a state where the clamp has swung in the device according to the third embodiment.
Figure 14:
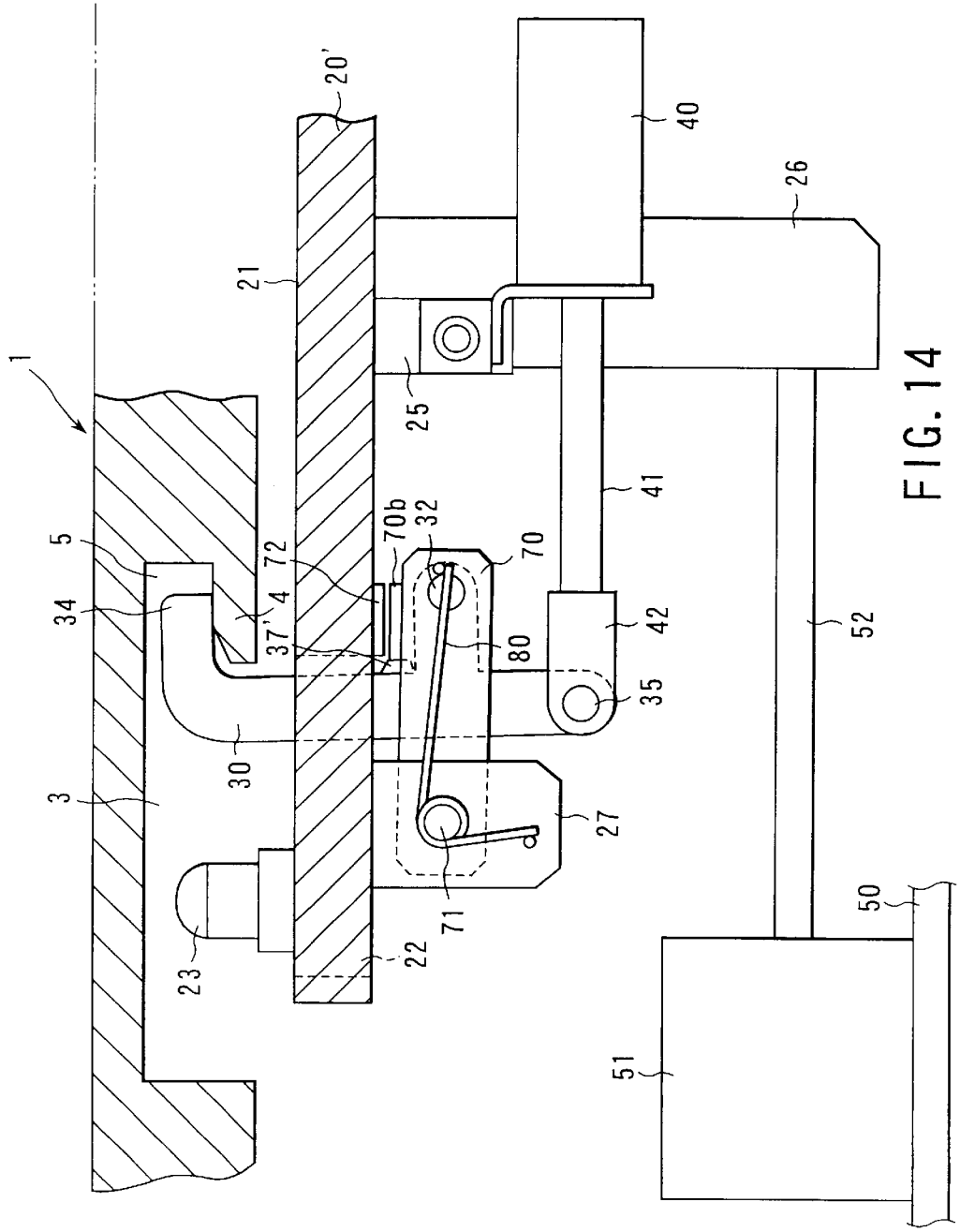
FIG. 14 is a view showing a state where the link has swung, following FIG. 13.

An explanation will be given of an operation of the attaching device 90, with reference to FIGS. 11, 13, and 14. FIGS. 13 and 14 are views showing a state where the clamp 30 of the attaching device 90 has swung.

First, the container 1 is placed on a mount portion 21 of the table 20' by an operator, and a switch (not shown) is operated by the operator to activate an actuator 40. The actuator 40 moves the rod 41 forward to move the pin 35 in an arrow a direction, as shown in FIG. 11. At this time, the clamp 30 swings in an arrow b direction (clockwise) about the pin 32 (the second rotational axis) used as the center. Consequently, the clamp 30 swings relative to the links 70, until the bumper 37' of the clamp 30 comes into contact with a side of the stopper plate 70b of the links 70, as shown in FIG. 13. When the bumper 37' comes into contact with the stopper plate 70b used as a clamp stopper, a hook 34 of the clamp 30 enters an engaging hole 5, but the distal end of the hook 34 does not come into contact with the upper side of a projecting piece 4. Namely, there is a small gap S between the hook 34 and the projecting piece 4.

From a state where the bumper 37' is in contact with the stopper plate 70b, the actuator 40 further moves the rod 41 forward in an arrow a' direction, whereby the pushing force of the actuator 40 onto the rod 41 overcomes the biasing force of the coil springs 80. Consequently, the swing action of the clamp 30 about the pin 32 used as the center is switched to a swing action of the links 70 about the pins 71 used as the center. The links 70 swing along with the clamp 30 in an arrow c direction (clockwise) about the pins 71 used as the center. As the links 70 swing about the pins 71 used as the center to move their distal ends downward, the clamp 30 also moves downward. As a result, as shown in FIG. 14, the hook 34 comes into contact with the lower surface of the engaging hole 5, i.e., the upper side of the projecting piece 4.

On the other hand, when the container 1 is detached from the mount portion 21, an operation is performed in reverse to that described above. Specifically, the actuator 40 moves the rod 41 backward, and the links 70 first swing counterclockwise about the pins 71 used as the center, whereby the hook 34 separates upward from the projecting piece 4. The rod 41 is further moved backward, and the clamp 30 swings counterclockwise about the pin 32 used as the center, whereby the hook 34 retreats from the engaging hole 5.

[3-3] Effect of Third Embodiment

The attaching device 90 according to this embodiment also uses the hook 34 of the clamp 30 to press down the projecting piece 4 of the container 1 from above. In the attaching device 90, when the hook 34 presses down the projecting piece 4, the links 70 swing while the bumper 37' of the clamp 30 is in contact with the stopper plate 70b of the links 70. Accordingly, when the hook 34 presses down the projecting piece 4, there is no energy loss caused by friction between the bumper 37 and the clamp stopper 22a, unlike the device 60 according to the second embodiment. As a result, the attaching device 90 according to the third embodiment allows the clamp 30 to fix the container 1 by a force larger than that in the device 60 according to the second embodiment.

[3-4] Modification of Third Embodiment

Figure 15:
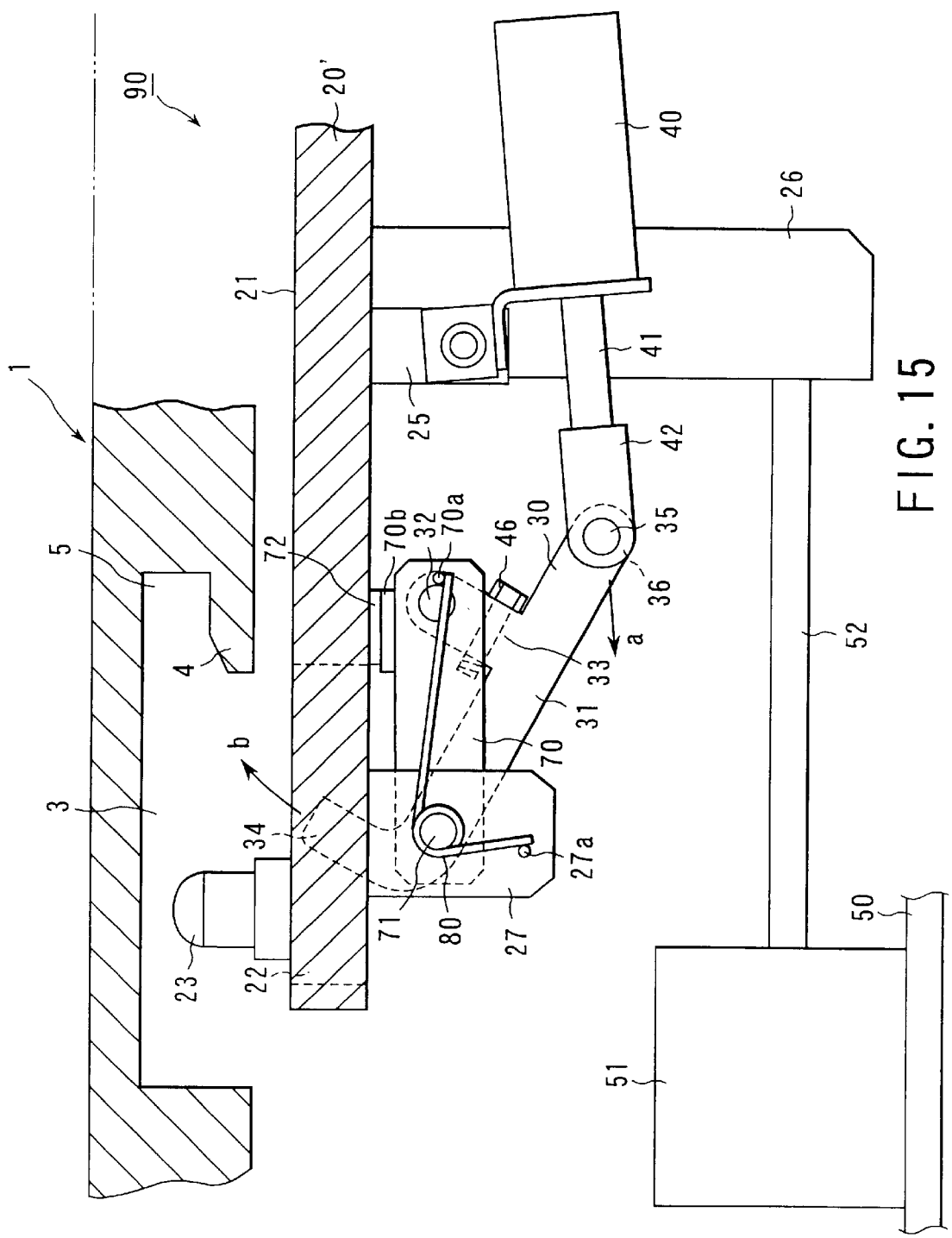
FIG. 15 is an enlarged view showing the main part of an attaching device according to a modification of the third embodiment.
Figure 16:
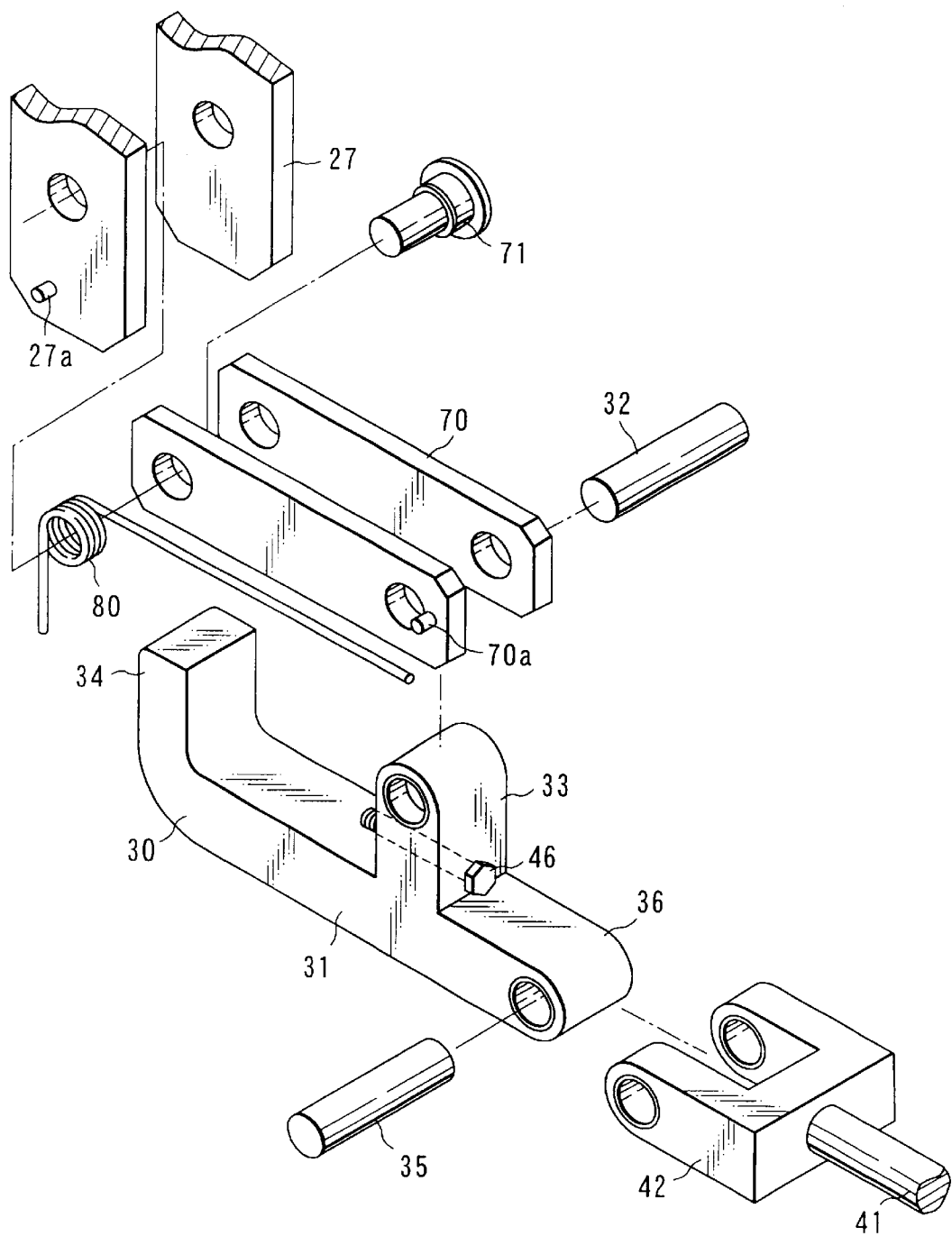
FIG. 16 is an exploded perspective view showing a clamp, links, and so forth employed in the device according to the modification shown in FIG. 15.

FIG. 15 is an enlarged view showing the main part of an attaching device according to a modification of the third embodiment. FIG. 16 is an exploded perspective view showing a clamp, links, and so forth employed in the device according to this modification. In the structure shown in FIG. 11, the bumper 37' of the clamp 30 comes into contact with a side of the stopper plate 70b of the links 70 to restrict the swing of the clamp 30. On the other hand, in the modification shown in FIG. 15, a bolt 46 is arranged in place of the bumper 37' to adjust a position at which the swing of a clamp 30 relative to links 70 stops.

Figure 17:
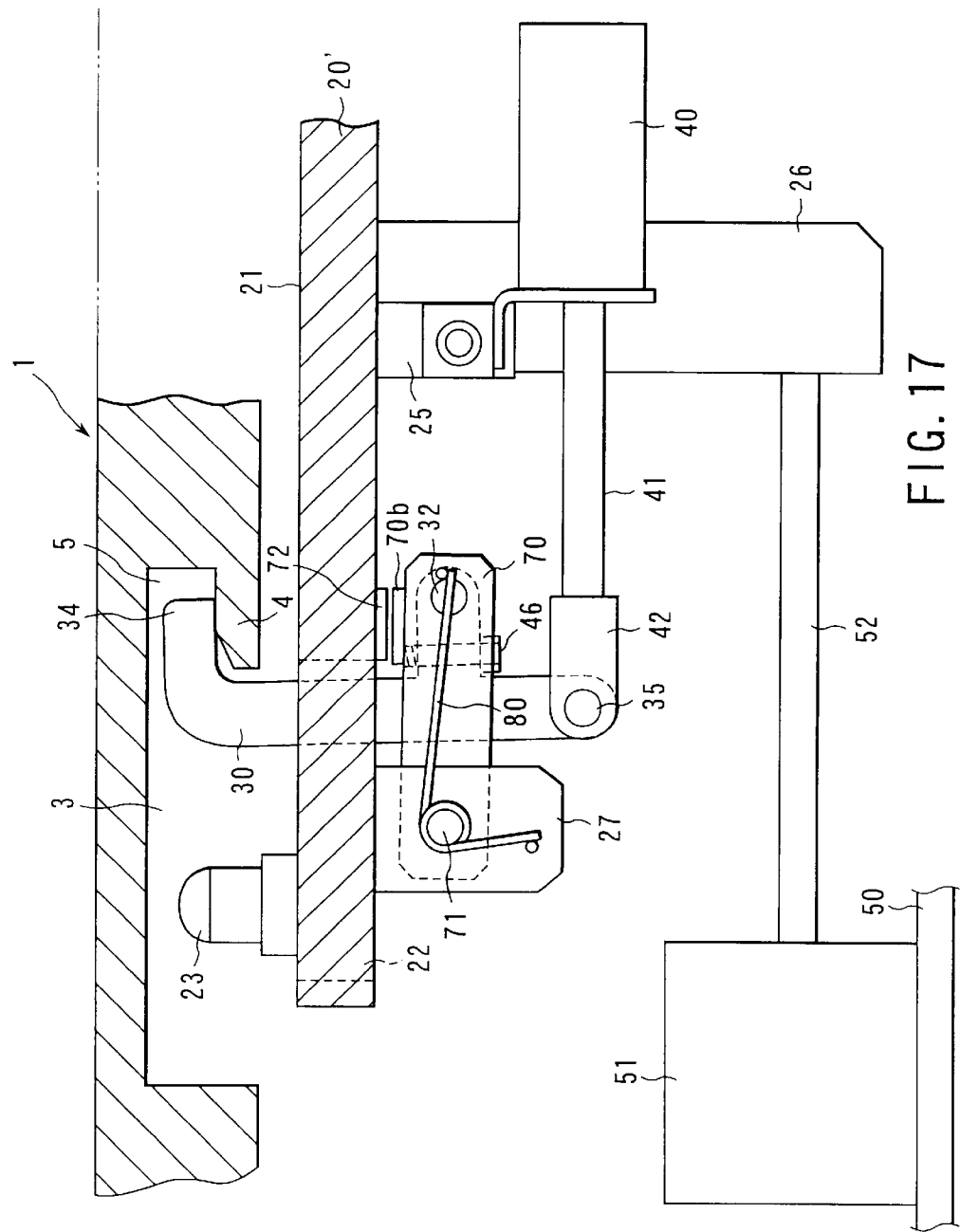
FIG. 17 is a view showing a state where the clamp has swung in the device according to the modification shown in FIG. 15.

More specifically, the bolt 46 is disposed at the proximal end of a pivot portion 33, and has a distal end projecting from the pivot portion 33 toward a hook 34. The distal end of the bolt 46 comes into contact with a stopper plate 70b thereby restricting the swing of the clamp 30 relative to the links 70, as shown in FIG. 17, when the clamp 30 swings relative to the links 70 clockwise in FIG. 15 about a pin 32 used as the center. That length on the distal end side of the bolt 46 which projects from the pivot portion 33 can be adjusted to arbitrarily set a position at which the swing of the clamp 30 is restricted.

In the first to third embodiments, means for restricting the swing of the clamp 30 is not limited to the structures described above, but may be any means for restricting the swing of the clamp 30 when the hook 34 of the clamp 30 engages with the engaging hole 5.

In the first to third embodiments, it is explained that a switch or the like is operated by an operator to activate the actuator 40 after the container 1 is placed on the mount portion 21. However, a container detection sensor may be arranged on the mount portion 21 or the like, so that the actuator 40 is automatically activated by a signal from the container detection sensor. Furthermore, an arrangement may be adopted such that the actuator 51 is automatically activated, after the clamp 30 securely holds the container 1.

In the first to third embodiments, each of the actuators 40 and 51 is formed of an electromagnetic liner actuator. They may be formed of an actuator, such as a hydraulic cylinder or a ball screw.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A device for attaching a transfer container, which accommodates a target substrate, to a port of a semiconductor processing apparatus, the transfer container having on a front side an opening portion to be aligned with the port, and on a bottom side a first engaging portion, the device comprising:
    a table having a mount portion on an upper side, on which the transfer container is placed, and an opening portion formed at a position corresponding to the first engaging portion;
    a link swingably supported on a lower side of the table about a first rotational axis used as a center;
    a clamp swingably supported by the link about a second rotational axis used as a center, and having a second engaging portion, which projects upward from the table through the opening portion to engage with the first engaging portion when the clamp swings in a first direction;
    a first actuator configured to apply a swing-driving force to the clamp; and
    a control structure configured to control swing of the link and the clamp, and set such that, when the first actuator applies a swing-driving force to the clamp in the first direction, the clamp swings relative to the link about the second rotational axis used as a center in a first period until the second engaging portion enters the first engaging portion, and then the link swings along with the clamp relative to the table about the first rotational axis used as a center, thereby moving the clamp downward for the second engaging portion to catch the first engaging portion in a second period following the first period.

2. The device according to claim 1, wherein the control structure comprises a biasing member, which provides the link with a biasing force in a direction so as to bias upward the second rotational axis, and a restricting member, which restricts swing of the clamp relative to the link, the biasing member being configured to cause the link not to swing following the clamp in the first period, the restricting member being configured to restrict swing of the clamp relative to the link so as for a swing-driving force applied to the clamp to be transmitted to the link through the second rotational axis in the second period.

3. The device according to claim 2, wherein the control structure further comprises a link stopper configured to stop the link swinging against the biasing force.

4. The device according to claim 2, wherein the restricting member comprises a clamp stopper, which comes into contact with the clamp to stop the clamp swinging at an end of the first period.

5. The device according to claim 4, wherein the clamp stopper is supported by the table.

6. The device according to claim 4, wherein the clamp stopper is supported by the link.

7. The device according to claim 4, wherein the control structure further comprises an adjusting member configured to adjust a position at which the clamp stopper stops the clamp swinging.

8. The device according to claim 7, wherein the adjusting member comprises a bolt, which is disposed on the clamp stopper or part of the clamp that engages with the clamp stopper, and whose projecting amount is adjustable.

9. The device according to claim 2, wherein the biasing member provides the link with a biasing force to cause the link to swing in a second direction reverse to the first direction, about the first rotational axis used as a center.

10. The device according to claim 2, wherein the biasing member comprises a coil spring, which provides the link with a rotational force about the first rotational axis used as a center.

11. The device according to claim 1, wherein the first actuator has a reciprocation rod pivotally supporting the clamp, and is swingably supported on the lower side of the table.

12. The device according to claim 11, wherein the reciprocation rod pivotally supports an end of the clamp reverse to the second engaging portion with the second rotational axis interposed therebetween.

13. The device according to claim 1, further comprising a second actuator configured to move the table along with the transfer container placed thereon toward and away from the port.

14. The device according to claim 1, wherein the second engaging portion comprises a hook, which enters an engaging hole of the first engaging portion.

* * * * *